United States Patent [19]

Myer

[11] Patent Number: 5,694,036

[45] Date of Patent: Dec. 2, 1997

[54] DIRECTION SENSOR AND DISTORTION REDUCTION CONTROL CIRCUITRY

[75] Inventor: Robert Evan Myer, Denville, N.J.

[73] Assignee: Lucent Technologies Inc., Murray Hill, N.J.

[21] Appl. No.: 512,005

[22] Filed: Aug. 7, 1995

[51] Int. Cl.$^6$ .................................................. G01R 1/30
[52] U.S. Cl. ................................. 324/73.1; 324/158.1
[58] Field of Search ........................... 324/73.1, 74, 130, 324/158.1; 330/2, 149; 364/571.04

[56] References Cited

U.S. PATENT DOCUMENTS

| | | | |
|---|---|---|---|
| 3,886,470 | 5/1975 | O'Neil et al. | 330/149 |
| 4,580,105 | 4/1986 | Myer | 330/149 |
| 4,879,519 | 11/1989 | Myer | 330/149 |
| 4,937,535 | 6/1990 | Underwood et al. | 330/2 |
| 4,949,029 | 8/1990 | Cooper et al. | 324/130 |
| 5,157,345 | 10/1992 | Kenington et al. | 330/149 |
| 5,283,536 | 2/1994 | Wheatley, III et al. | 330/149 |

*Primary Examiner*—Ernest F. Karlsen

[57] ABSTRACT

A direction sensor is provided in an automatic control circuit which is incorporated into a distortion reduction circuit. The direction sensor is comprised of a test switch, first and second storage devices, a comparison device, a normalization device and a sampling control device. The direction sensor conducts a series of consecutive test cycles, comprised of even numbered test cycles and odd numbered test cycles, and during each test cycle a sample of the test signal is taken. During the even numbered test cycles the sampling control device causes the test switch to transfer an even numbered sample of the test signal to the first storage device and thereafter to the first input of the comparison device, where the even numbered sample is compared with an earlier in time odd numbered sample at the second input of the comparison device. The comparison device produces a first comparison signal indicative of the relative value of the samples. During odd numbered test cycles, the sampling control device is adapted to cause the test switch to transfer an odd numbered sample of the test signal to the second storage device and thereafter to the second input of the comparison device, where the odd numbered sample is compared with an earlier in time even numbered sample at the first input of the comparison device. The comparison device produces a second comparison signal indicative of the relative value of the samples. A normalization signal from the sampling control device and the comparison signal from the comparison device are combined to produce a direction signal.

40 Claims, 6 Drawing Sheets

TIMER 422, $P_3$

FLIP-FLOP 426, $P_3$
(CLOCK INPUT)

SWITCH 416, $P_{12}$

SWITCH 416, $P_6$

EXOR 428, $P_6$
(FOR PEAK SET TO 0)

EXOR 428, $P_5$
(INITIAL NORMALIZE SIGNAL)

EXOR 428, $P_4$
(FINAL NORMALIZE SIGNAL)

COMPARATOR 440, $P_6$

EXOR 450, P3
(DIRECTION SIGNAL)

NOR 500 P5,P6
(CLOCK SIGNAL FOR POLARITY)

NOR 500, P2
(CLOCK SIGNAL FOR POLARITY)

NOR 500, P3
(POLARITY CHANGE SIGNAL)

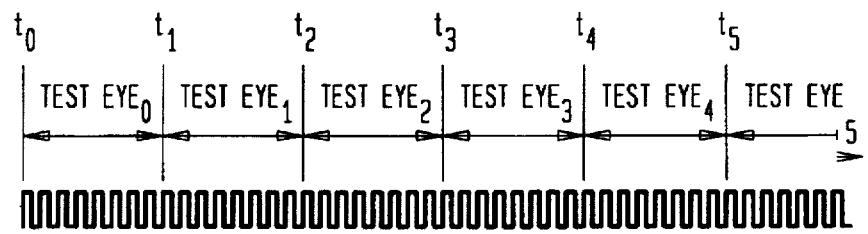

5,694,036

DIRECTION SENSOR AND DISTORTION REDUCTION CONTROL CIRCUITRY

FIELD OF THE INVENTION

The present invention, relates to the field of direction sensors for providing an indication of the direction of change of a test signal and also to the implementation of such sensors in a distortion reduction circuit.

BACKGROUND OF THE INVENTION

R. E. Myer, U.S. Pat. No. 4,580,105, issued Apr. 1, 1986 discloses a circuit in FIG. 2 of that reference for reducing distortion. The contents of that patent are incorporated herein by reference. The signal appearing at output 27 of FIG. 2 of that patent, can be thought of as a "distorted carrier signal". The signal appearing at output 29 can be thought of as a "correction signal". Myer U.S. Pat. No. 4,580,105 discloses the reduction of the distortion in the distorted carrier signal by feedback adjustments provided by automatic control circuit 32, which are provided to the correction signal.

The manner in which these adjustments are accomplished is disclosed further in FIGS. 4 and 5 of that patent. A direction sensor 330, shown in FIG. 4, determines the direction of change of a pilot signal from a first sample value to a second during a test period. The first sample is applied to capacitor C3 and the second to capacitor C4 of the direction sensor 330. If the samples show an increase in the pilot signal, the polarity of one or more of the adjustment current sources 360 is reversed and an adjustment signal is applied to attenuator and phase circuit 40 to adjust the correction signal. The sequence is repeated for two new samples for a second test period. In each test period the sample first in time is applied to capacitor C3 and the sample second in time is applied to capacitor C4.

Myer, U.S. Pat. No. 4,580,105 also discloses two separate Flip-Flops 342 and 344 and two separate current sources 360 for providing two outputs to adjust a signal.

SUMMARY OF THE INVENTION

One embodiment of the present invention provides a direction sensor which can be used in an automatic control circuit that is incorporated into a distortion reduction circuit. The direction sensor is preferably comprised of a test switch, first and second storage devices, a comparison device, a normalization device and a sampling control device. The direction sensor is adapted to conduct a series of consecutive test cycles, comprised of odd numbered test cycles and even numbered test cycles, and during each test cycle a sample of the test signal is taken.

During the even numbered test cycles the sampling control device is adapted to cause the test switch to transfer an even numbered sample of the test signal to the first storage device and thereafter to the first input of the comparison device, where the even numbered sample is compared with an earlier in time odd numbered sample at the second input of the comparison device. The comparison device produces a first comparison signal indicative of the relative value of the samples. During odd numbered test cycles, the sampling control device is adapted to cause the test switch to transfer an odd numbered sample of the test signal to the second storage device and thereafter to the second input of the comparison device, where the odd numbered sample is compared with an earlier in time even numbered sample at the first input of the comparison device. The comparison device produces a second comparison signal indicative of the relative value of the samples.

Because the sample first in time will alternately be at the first input of the comparison device and then at the second input of the comparison device, the comparison device produces a comparison signal which alternates from test cycle to test cycle between a digital "1" and a digital "0", when the test signal is moving in one direction. Thus a normalization signal is provided by the sampling control device and combined with the comparison signal by the normalization device. The direction signal output from the normalization device is a constant digital value if the test signal is changing in one direction (i.e. steadily increasing or steadily decreasing).

In some embodiments of the present invention the direction sensor is used in an automatic control circuit which is part of a distortion reduction circuit. The distortion reduction circuit preferably comprises a signal combiner, an attenuator and phase circuit, a coupler, and the automatic control circuit. A correction signal is provided to the attenuator and phase circuit and the automatic control circuit adjusts it to form an adjusted correction signal. The adjusted correction signal and a distorted carrier signal are combined in the signal combiner to reduce distortion in the distorted carrier signal. The signal combiner produces a relatively clean carrier signal at its output. The coupler takes a portion of the distortion signal and feeds it back to the automatic control circuit for once again producing an adjustment signal to adjust the correction signal.

The automatic control circuit of the present invention is preferably comprised of the direction sensor, an adjustment signal source, an output switch, and an output control device. The output switch and output control device in accordance with the present invention sends the adjustment signal to one of two outputs. During a first output cycle the output control device causes the output switch to transfer the adjustment signal at its data input to its first data output. During a second output cycle the output control device causes the output switch to transfer the adjustment signal at its data input to its second data output. During each output cycle the adjustment signal is responsive to a direction signal from the direction sensor and the adjustment signal provided is determined at least in part by the direction signal.

The direction sensor of the present invention allows more accurate control of adjustments to a correction signal for reducing distortion. Since each sample is compared with the very next sample in time, there can be a quicker response to changes in the test signal. The output switch and output control device of the present invention allow a single adjustment signal source to be used.

In this application the term "connected" includes operative connections provided between wireless devices and is not limited to conventional conductor connections.

BRIEF DESCRIPTION OF THE DRAWINGS

FIG. 6 is a timing diagram of the direction sensor and control circuitry operation for finding a null.

DETAILED OF THE DRAWINGS

In many of the embodiments of the present invention data outputs and inputs are referred to. "Data" is used in a broad sense and can include both analog and digital information.

Figure 1:
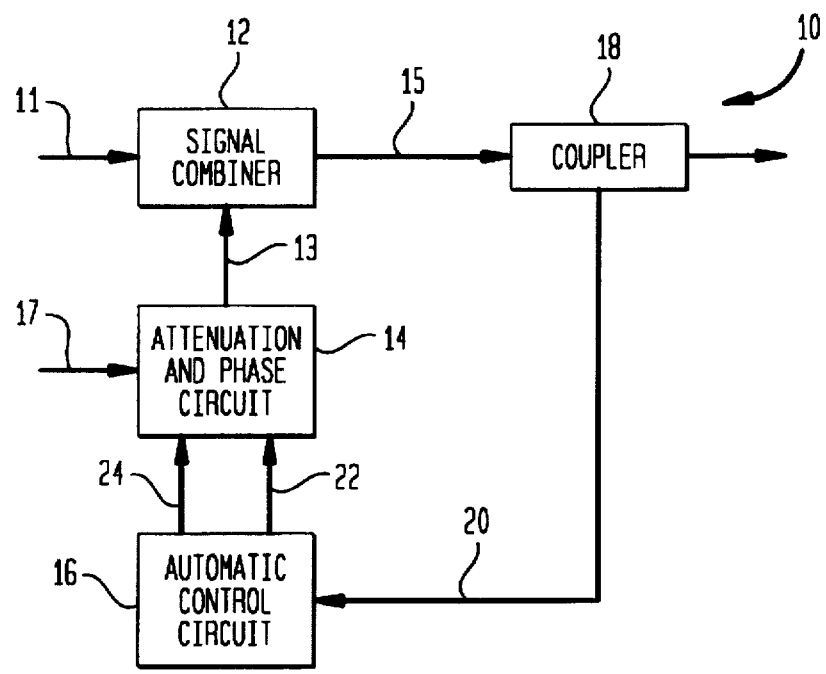
FIG. 1 illustrates a block diagram of a circuit for providing a feedback signal to adjust the gain and phase of a correction signal for reducing distortion.

FIG. 1 shows a circuit 10 for reducing distortion, employing an automatic control circuit 16, which includes the direction sensor of an embodiment of the present invention as will be later described. Circuit 10 provides a feedback signal to adjust a correction signal for reducing distortion. The circuit 10 includes a signal combiner 12, an attenuation and phase circuit 14, an automatic control circuit 16, and a coupler 18. The overall design of such a circuit 10 is known in the art and can be derived from the circuit shown in FIG. 2 of Myer, U.S. Pat. No. 4,580,105, the contents of which are incorporated by reference herein. However, the operation and design of the automatic control circuit 16 differs from that shown in Myer, U.S. Pat. No. 4,580,105, as will be further described with reference to FIGS. 2A–2D and 3.

The overall operation of the circuit 10 in FIG. 1 will now be described. The signal combiner 12 receives a distorted carrier signal at its first input 11 and an adjusted correction signal from the attenuation and phase circuit 14, at its second input 13. The signal combiner 12 combines the distorted carrier signal and the adjusted correction signal to form a "clean" carrier signal, at its output 15, which is substantially free of distortion. A majority of the clean carrier signal is sent to other circuitry via coupler 18. However a small portion of the clean carrier signal is used as a feedback signal and sent to the automatic control circuit 16 via input 20.

The automatic control circuit 16 uses the feedback signal at input 20 to create two control signals at outputs 22 and 24, respectively. The control signals are applied to the attenuation and phase circuit 14 and are used as adjustment signals to adjust the gain and phase of a correction signal appearing at the data input 17 of the attenuation and phase circuit 14. The adjusted correction signal, from input 13, is again combined with the distorted carrier signal, from input 11, in the signal combiner 12. This feedback technique preferably continuously adjusts the correction signal to provide maximum reduction of distortion.

Figure 2A:
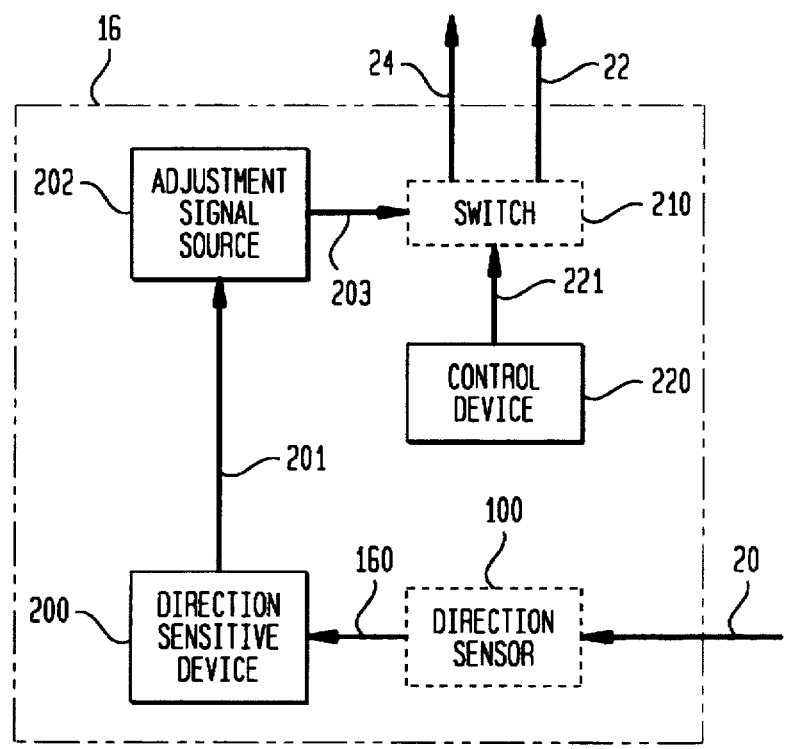
FIG. 2A is a block diagram of a automatic gain and phase control circuit employing the direction sensor of an embodiment of the present invention for use in the circuit of FIG. 1.

FIG. 2A shows a block diagram of the automatic control circuit 16, for use in the circuit of FIG. 1, in accordance with an exemplary embodiment of the present invention. The automatic control circuit 16 typically includes a direction sensor 100, a direction sensitive device 200, an adjustment signal source 202, a switch 210, and a control device 220.

In operation, the automatic control circuit 16 shown in FIG. 2A receives a feedback signal, which will be called a "test signal" at the input 20. The test signal is processed by the direction sensor 100, the details of which will be described subsequently with reference to FIGS. 2B and 2C. The direction sensor 100 produces a direction signal at the output 160 which is indicative of the direction of change of the test signal. The direction signal is applied to direction sensitive device 200, which produces a change source signal, on output 201, indicating when an adjustment signal from the adjustment signal source 202 needs to be changed. The change source signal is applied to the adjustment signal source 202.

The adjustment signal source 202 is adapted to be capable of supplying currents of either negative or positive polarity. When a change source signal is received by the adjustment signal source 202 from the direction sensitive device 200, the adjustment signal source 202 is toggled to change the polarity of the source signal from negative to positive or positive to negative, as the case may be. The adjustment signal having the appropriate polarity is supplied from the adjustment signal source 202 on lead 203 to the switch 210. As shown in FIG. 2D, the switch 210 preferably comprises conductors 212 and 214, and dual switch 216.

The control device 220 thereafter directs the adjustment signal to one of the two data outputs of the switch 210, by sending an appropriate control signal to control input 221 to the switch 210. During a first output cycle the adjustment signal is transferred to the first data output 24 of the switch 210, while during a second output cycle the adjustment signal is transferred to the second data output 22 of the switch 210. Intermediate buffer circuitry, which will be described with reference to FIG. 4, can be provided to the outputs 24 and 22 before they are applied to the attenuation and phase circuit 14 of FIG. 1. The adjustment signals from the outputs 24 and 22 are each used to control gain and phase of a correction signal as described previously.

Figure 2B:
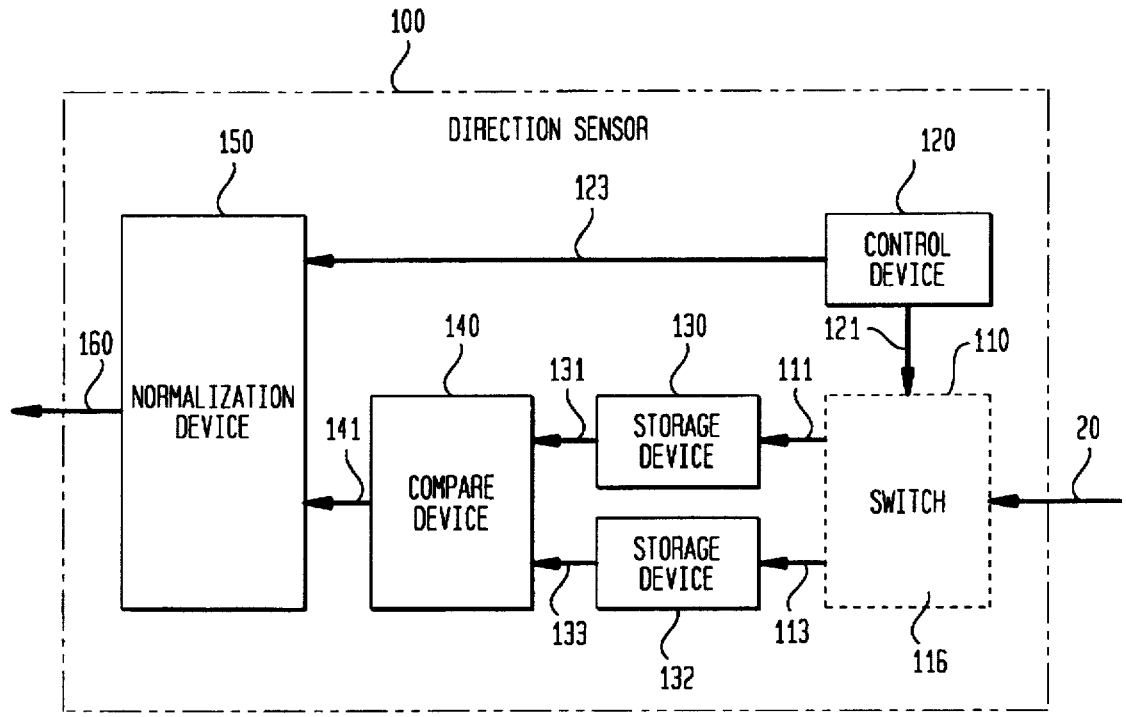
FIG. 2B illustrates an embodiment of the direction sensor of FIG. 2A.
Figure 2C:
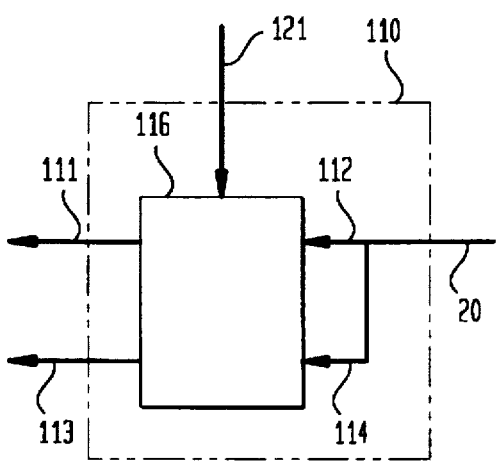
FIGS. 2C and 2D illustrate an embodiment of switch 110 and switch 210.
Figure 2D:
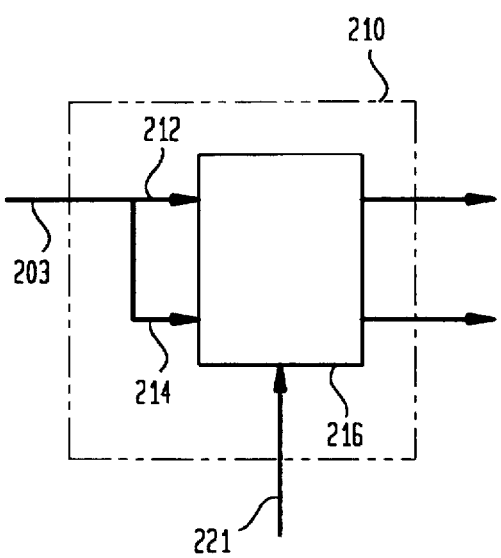
Figure 3:
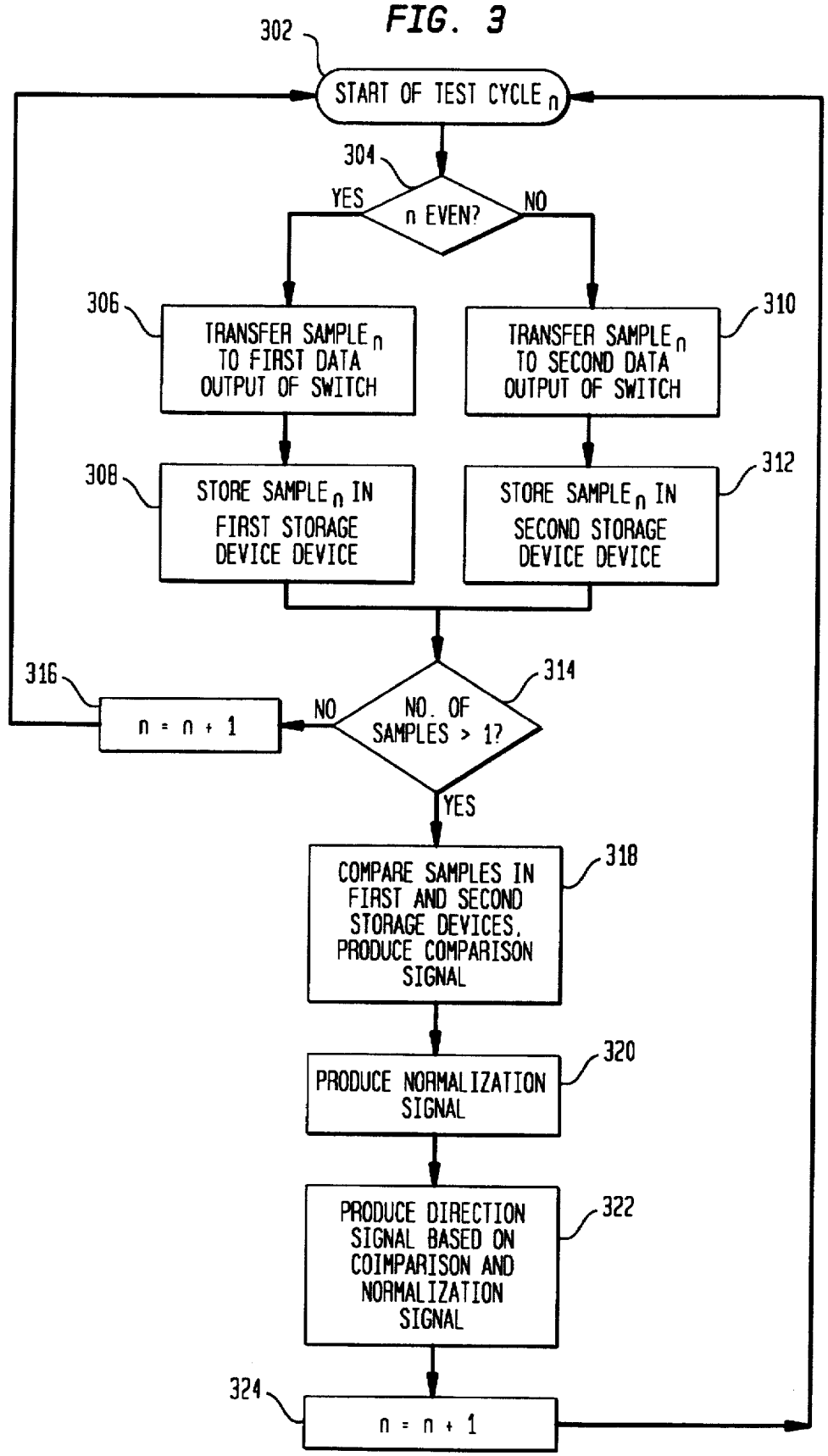
FIG. 3 is a flow chart of the operation of the direction sensor in FIG. 2.

The direction sensor 100, shown in detail in FIG. 2B, is typically comprised of a switch 110, a control device 120, two storage devices 130 and 132, a comparison device 140, and a normalization device 150. As shown in FIG. 2C, the switch 110 is preferably comprised of conductors 112 and 114 and a dual switch 116. The operation of the direction sensor 100 will be described with reference to the flow chart 300 of FIG. 3.

The nth test cycle begins at step 302. The integer n is used to indicate that the operation of direction sensor 100 may be started at any time. If n is even, a first control signal is applied by control device 120, on control output 121, to the switch 110 to transfer the nth sample of the test signal from the input 20 to the first data output 111 of the switch 110 at steps 304 and 306. Again, if n is even, the nth sample is stored in the first storage device 130 in FIG. 2, at step 308. If n is odd, a second control signal is applied by control device 120 to the switch 110, on control input 121 to transfer the nth sample of the test signal from the input 20 to the second data output 113 of the switch 110 and then to the second storage device 132 at steps 310 and 312.

At step 314 it is determined if the number of samples is greater than 1. If only one sample has been taken, n is effectively incremented at step 316 by going to the next sample and the next test cycle at step 302. If at least two samples have been taken, the samples in the first and second storage devices 130 and 132, respectively, are compared by comparison device 140, which produces a comparison signal on output 141 at step 318. A normalization signal is produced by control device 120, on its second control output 123 at step 320. The normalization device 150 combines the comparison signal and the normalization signal to produce a direction signal on output 160 at step 322. At step 324 n is effectively incremented by starting another test cycle and the testing loop begins again at step 302.

The quantity "n" has been used for explanation purposes, however an actual quantity "n" does not have to exist or be examined. Rather control device 120 may simply alternate between transferring samples of the test signal from the input 20 to the first data output 111 of the switch 110, during "even" test cycles, and then to the second data output 113 of the switch 110, during "odd" test cycles. This has the effect of supplying even numbered samples to the first storage device 130 and odd numbered samples to the second storage device 132 or vice versa. In addition, the terms "even" and "odd" have merely been used to show that switching and storage alternates from test cycle to test cycle.

Figure 4:
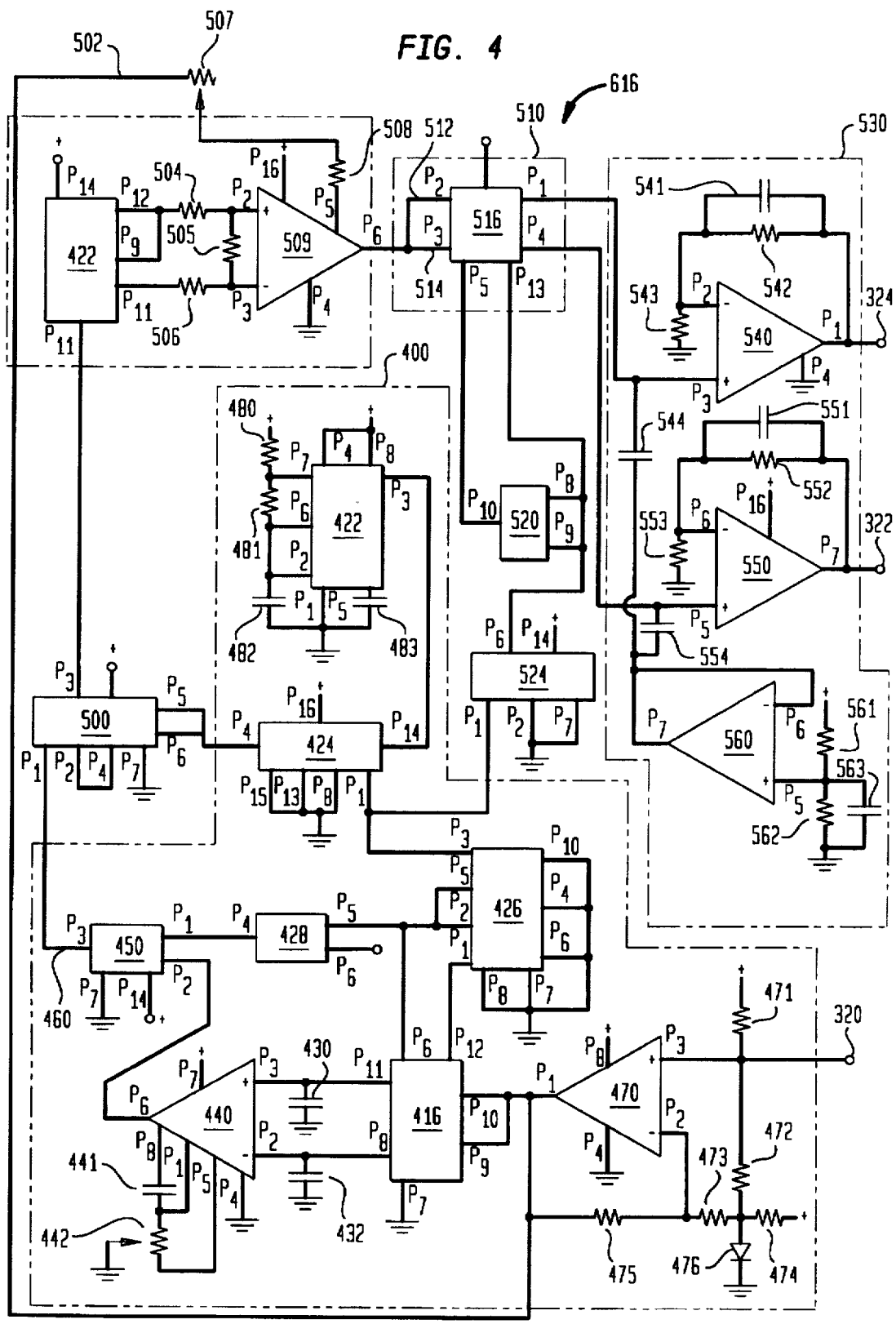
FIG. 4 is a detailed schematic of an automatic gain and phase control circuit.

FIG. 4 is detailed circuit diagram of a typical automatic control circuit 616 in accordance with an embodiment of the present invention. The automatic control circuit 616 is analogous to the automatic control circuit 16 in many respects as will be described.

The automatic control circuit 616 is preferably comprised of a direction sensor 400, a dual NOR gate 500 which is part of direction sensitive circuitry, an adjustment current source 502, a switch 510, and a control device 520. These components have analogous functions to similarly numbers components in FIG. 2A. The automatic control circuit 616 also comprises an output buffer circuit 530.

In operation, a test signal is received at input 320 and processed by direction sensor 400 to produce a direction signal at output 460 which is indicative of the direction of change of the test signal. The direction sensor 400 will be described in more detail later. The direction signal is applied to an input of the dual NOR gate 500. The dual NOR gate 500 is preferably part of a 4001 Quad 2-Input NOR Gate. The dual NOR gate 500 produces a change source signal based on the direction signal at its input. The change source signal is applied to the current source 502. When the change source signal makes a transition from a digital "0" to a digital "1", the adjustment current source 502 is toggled from positive to negative polarity or vice versa. The adjustment signal from the adjustment current source 502 is applied to the input of the switch 510, which is controlled by the control device 520, as well as the counter 524, to supply the adjustment signal to either its first output at $P_1$ or its second output at $P_4$. The adjustment signal is supplied to the inverting input of either an amplifier 540 or an amplifier 550.

The direction sensor 400 is preferably comprised of buffering circuitry which includes amplifier 470, control circuitry which includes timer 422, sequencer 424, Flip-flop 426, and Exclusive-Or gate 428, and other circuitry which includes dual switch 416, first and second storage capacitors 430 and 432, comparator 440, and normalization exclusive-or gate 450.

The amplifier 470 of the buffering circuitry, is preferably a 3260 amplifier. $P_3$ of amplifier 470 is connected to the input 320 for supplying the test signal, and is also connected to a resistor 471, having a value of 470 kilo-ohms, whose other end is connected to the voltage supply. Resistors 472, 473, and 474 provide a bias for amplifier 470, and these resistors and have values of 100 kilo ohms, 10 kilo ohms, and 47 kilo ohms, respectively. Resistor 475 provides feedback which controls the gain of amplifier 470 and has a value of 20 kilo ohms. Diode 476 is used to provide a minimum D.C. input. Resistors of other values can be used.

The output of the amplifier 470 is preferably connected to the two data inputs of the dual switch 416 at $P_{10}$ and $P_9$. The dual switch 416 is preferably part of a 4066 Quad Bilateral Switch. The two data outputs of the dual switch 416 are connected to the first and second storage capacitors 430 and 432 at $P_{11}$ and $P_8$. The storage capacitors 430 and 432 preferably have values of 0.1 farads. The output of the storage capacitors 430 and 432 are connected to comparator 440 at $P_3$ and $P_2$, respectively. Comparator 440 is preferably a 3130A comparator which has a high input impedance. A capacitor 441, having a value of 10 picofarads and a 100 kilo-ohm potentiometer 442 are attached at $P_8$ and $P_1$ as shown to precisely adjust the D.C. offset. This means that with no input to the comparator 440, noise causes the output of the comparator 440 to randomly vary from a digital high to a digital low. The output of the comparator is connected to one input at $P_2$ of the normalization NOR gate 450.

The timer 422 of the control circuitry is preferably a 555 timer. Resistors 480, 481, and capacitors 482 and 483, having values of 33 kilo-ohm, 33 kilo-ohm, and 1000 picofarads and 0.01 farads are provided for control of the timer 422 frequency. The timer 422 is connected at its output $P_3$ to $P_4$ of a sequencer 424. The sequencer 424 is preferably a 4022 Divide-by-8 Counter/Divider with 8 Decoded Outputs. Sequencer 424 is connected at its "decoded output 1" at $P_1$ to $P_3$ of the flip flop 426. Sequencer 424 is also connected at its "decoded output 1" at $P_1$ to $P_1$ of the counter 524. In addition, sequencer 424 is connected at its "decoded output 5" at $P_4$ to two inputs at $P_5$ and $P_6$ of dual NOR gate 500.

Flip-flop 426 is preferably a Dual-D flip-flop. Flip-flop 426 is connected to a first input of the Exclusive-or gate 428, at $P_5$, and to a first control input of the dual switch 416 at input $P_6$. Flip-flop 426 is connected to a second control input of the dual switch 416 at input $P_{12}$. Exclusive-or gate 428 along with Exclusive-or gate 450, is part of a 4070 Quad 2-Input Exclusive-or Gate. Exclusive-or gate 428 has a second input at $P_6$ which is used to receive a signal indicating whether a null or peak is being searched for, as will be described. The output of Exclusive-or gate 428 is connected to the first input of Exclusive-or gate 450.

The adjustment current source 502 is comprised of a flip-flop 503. The flip-flop 503 is preferably part of a 4013 Dual-D Flop. The flip-flop 503 is connected at $P_{12}$ through a resistor 504, having a value of 10 kilo-ohms, to the non-inverting input of amplifier 509. Amplifier 509 may be a 3080 amplifier and preferably is a transconductance operational amplifier which can be used as a current source. The flip-flop 503 is also connected at $P_{11}$ through a resistor 506 to the inverting input of amplifier 509. $P_{12}$ is connected back to $P_9$ for to provide the toggling mechanism. A resistor 505 having a value of 10 kilo-ohms is connected across the inverting and non-inverting terminals of amplifier 509 to correctly bias the amplifier 509. The current from the amplifier 509 is controlled in part by the test signal from the amplifier 470 which is supplied through a 1 mega-ohm potentiometer 507 and a resistor 508, having a value of 100 kilo-ohms.

The output of amplifier 509 is connected, through conductors 512 and 514, to first and second data inputs of dual switch 516 at $P_2$ and $P_4$ respectively. Dual switch 516 is preferably controlled by counter 524 which receives input pulses at $P_1$ from the sequencer 424. Counter 524 is preferably a 7-Stage Ripple-Carry Binary Counter. The $P_6$ pin of Counter 524 is connected to NOR gate 520 at inputs $P_8$ and $P_9$, and to dual switch 516 at $P_{13}$. The output of NOR gate 520 is connected to dual switch 516 at $P_5$. Nor gate is preferably part of a Quad Nor Gate.

The buffer circuitry 530 is typically comprised of amplifiers 540, 550 and 560. All three amplifiers can be 3260 amplifiers. Preferably, amplifiers 540 and 550, like comparator 440 described previously, have high input impedance. Amplifiers 540 and 550 have the same components connected to their inputs, and thus only amplifier 540 needs to be described. Amplifier 540 has a 1 microfarad capacitor 544 connected at its non-inverting input. This capacitor 544 is charged by current from amplifier 509 through dual switch 516 and holds the voltage constant while dual switch 516 is connected to capacitor 554. A resistor 542, having a value of 100 kilo-ohms, in parallel with a capacitor 541, having a value of 100 picofarads, is connected across the inverting input and the output of amplifier 540.

The amplifier 560 is used as a mid-voltage reference to set capacitors 544 and 554 to an initial value. The resistors 561 and 562 shown have values of 10 kilo-ohms, each. The capacitor 563 has a value of 1 microfarad.

Figures 5A, 5B, 5C, 5D, 5E, 5F, 5G, 5H, 5I, 5J, 5K, 5L:
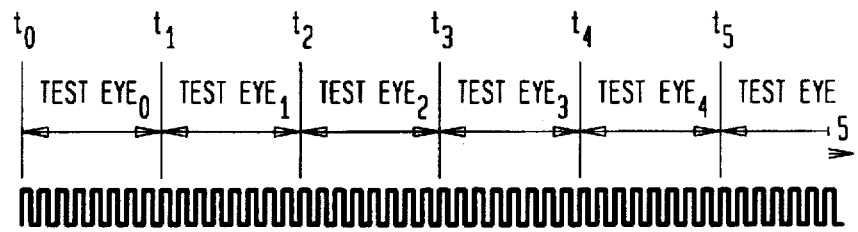
FIG. 5 is a timing diagram of the direction sensor and control circuitry operation for finding a peak.

The operation of the circuit of FIG. 4 will be described with reference to FIGS. 5 and 6. FIGS. 5 and 6 show timing diagrams for the situations where a peak is being searched for and a null is being searched for, respectively.

Referring to FIG. 5, a series of consecutive test cycles: test-cyc$_0$, test-cyc$_1$, test-cyc$_2$, test-cyc$_3$, test-cyc$_4$, and test-cyc$_5$ are shown. Each test-cyc$_i$ typically begins at time $t_i$ and ends at time $t_{i+1}$. Starting at $t_0$, timer 422, shown in FIG. 4, provides clock pulses at output P$_3$, as shown in FIG. 5, on line A. The clock pulses are received at P$_{14}$ of sequencer 424. Sequencer 424 has eight outputs one of which is active high for one clock cycle. Sequencer 424 sends a digital "1" signal out at P$_1$, starting at $t_0$ and ending one timer 422 clock cycle later. This signal is received as the clock input P$_3$ of flip-flop 426, as shown in FIG. 5 on line B.

After the clock input at P$_3$ is received, the flip-flop 426 sends a digital "1" signal to its output P$_1$ and this signal is received by dual switch 416 at p$^{12}$, as shown on line C of FIG. 5. The digital "1" signal at P$_{12}$ of dual switch 416 functions as a control signal causing the first data input at P$_{10}$ of dual switch 416 to be connected to the first data output at P$_{11}$. At the same time, $t_0$, the flip-flop 426 sends a digital "0" signal from output P$_2$ to input P$_6$ of dual switch 416, as indicated on line D, causing the second data input at P$_9$ of dual switch 416 to be disconnected from the second data output at P$_8$ of dual switch 416.

Since FIG. 5 refers to peak detection, the second input at P$_6$ of Exclusive-Or Gate 428 is set to "0" at time, $t_0$, as shown on line E of FIG. 5. The Exclusive-or Gate 428 receives an initial normalize signal at its first input P$_5$ as shown on line F of FIG. 5 from P$_2$ of Flip-Flop 426. The initial normalize signal alternates from a digital "0" during even test cycles to a digital "1" during odd test cycles. A final normalize signal is sent from the output P$_4$ of Exclusive-or Gate 428 and is indicated on line G of FIG. 5. For peak detection the initial normalize signal is the same as the final normalize signal.

Assuming the test signal is increasing for the first three test cycles, the comparator 440 produces a comparison signal at its output P$_6$, which is a digital "1" during even test cycles and a digital "0" during odd test cycles, as shown on line H of FIG. 5. Assuming the test signal is decreasing for the second three test cycles, the comparator 440 produces a comparison signal at its output P$_6$, which is a digital "0" during even test cycles and a digital "1" during odd test cycles, as shown on line H of FIG. 5.

The final normalize signal and the comparison signal are applied to the first and second inputs, P$_1$ and P$_2$ respectively, of the Exclusive-Or-Gate 450, and a direction signal is produced at the output P$_3$ of Exclusive-or-Gate 450, as shown on line I of FIG. 5. The direction signal is a digital "1" for the first three test cycles indicating an increasing test signal and a digital "0" for the second three test cycles indicating a decreasing test signal.

The direction signal is applied to the input P$_1$ of the dual NOR Gate 500. The dual NOR gate 500 receives a clock signal at inputs P$_5$ and P$_6$, shown on line J of FIG. 5, which is a delayed version of the clock input for Flip-Flop 426 for switching test signal samples shown on line B of FIG. 5. The delay is done to allow transients to settle. When the clock signal at inputs P$_5$ and P$_6$ of NOR gate 500 is a digital "1", the output P$_4$ and consequently the input P$_2$ are digital "0"'s. The polarity change signal has a digital "0" value indicating that the polarity of the adjustment current source 502 is not to be changed, except when the clock signal at inputs P$_5$ and P$_6$ of dual NOR gate 500 is a digital "1" and when the direction signal at input P$_1$ is a digital "0", indicating a decreasing test signal. The polarity change signal for an increasing and decreasing test signal is shown on line L of FIG. 5. Line K of FIG. 5 shows the signal at input P$_2$ of dual NOR gate 500.

The timing diagram for detection of a null is shown in FIG. 6. The signals shown on lines A, B, C, D, F, H, J, and K in FIG. 6 for null detection are typically the same as the corresponding lines shown in FIG. 5 for peak detection. The signals shown on lines E, G, I, and L differ from those in FIG. 5 as shown. In particular, the signal shown on line E is preferably set to a digital "1" for null detection. The final normalize signal shown at line G of FIG. 6 is an inverted version of that shown for peak detection in FIG. 5. The direction signal at line I of FIG. 6 is also inverted from that shown for peak detection. The polarity change signal at line L of FIG. 6 differs in that an increasing test signal will cause a polarity change of the adjustment current source 502.

In either the peak detection case or the null detection case, the transition of the polarity change signal from a digital "0" to a "1" causes the adjustment current source 502 to switch the direction of the current it provides at the output P$_6$ of amplifier 509 of FIG. 4, by toggling the flip-flop 503, to provide a digital "1" to the output P$_{12}$ and a digital "0" to the output P$_{11}$ or to provide a digital "0" to the output P$_{12}$ and a digital "1" to the output P$_{11}$. An adjustment signal of the appropriate polarity is produced at output P$_6$ of amplifier 509. The magnitude of the adjustment signal is controlled by the test signal from output P$_1$ of the amplifier 470 which is applied through potentiometer 507 and resistor 508.

The adjustment signal is applied to the non-inverting input of one of the amplifiers 540 and 550 by the dual switch 516. The dual switch 516 is preferably controlled so that during eight consecutive output cycles as determined by the counter 524, the dual switch 516 connects its first data input at P$_2$ to its first data output at P$_1$, to supply the adjustment signal to amplifier 540. During the next eight consecutive output cycles the dual switch 516 connects its second data input at P$_3$ to its second data output at P$_4$, to supply the adjustment signal to amplifier 550. Each amplifier has a capacitor, 544 and 554, respectively, for retaining the adjustment signal.

The adjustment signal appears at one of outputs 324 and 322, which are analogous to outputs 24 and 22 shown in FIG. 1. The adjustment signal is preferably a D.C. signal which is used to adjust a correction signal for reducing distortion as shown in FIG. 1.

I claim:

1. A direction sensor for detecting the direction of change of a test signal comprising:
   a test switch having a data input, first and second data outputs, and a control input;
   a first storage device having an input connected to the first data output of the test switch and an output;

a second storage device having an input connected to the second data output of the test switch and an output;

a comparison device having a first input connected to the output of the first storage device and a second input connected to the output of the second storage device, and an output;

a normalization device having, a first input, a second input connected to the output of the comparison device, and an output;

a control device having a first output connected to the control input of the test switch and a second output connected to the first input of the normalization device;

wherein the direction sensor is adapted to conduct a series of consecutive test cycles comprised of even numbered test cycles and odd numbered test cycles, and during each test cycle a sample of the test site test signal is taken:

wherein during the even numbered test cycles:

the control device is adapted to supply a first control signal to the control input of the test switch causing the test switch to transfer an even numbered sample of the test signal at the data input of the test switch to the first data output of the test switch, from where the even numbered sample is supplied to the first storage device and thereafter to the first input of the comparison device;

the comparison device is adapted to compare an even numbered sample at its first input, with an earlier in time odd numbered sample at its second input, and produces a first comparison signal indicative of the relative value of the samples;

the control device produces a normalization signal at its second output; and the normalization device receives the normalization signal from the control device at its first input and the first comparison signal at its second input and produces a signal indicative of the direction of change of the test signal; and wherein during the odd numbered test cycles:

the control device is adapted to supply a second control signal to the control input of the test switch causing the test switch to transfer an odd numbered sample of the test signal at the data input of the test switch to the second data output of the switch, from where the odd numbered sample is supplied to the second storage device and thereafter to the second input of the comparison device;

the comparison device is adapted to compare an odd numbered sample at its second input with an earlier in time even numbered sample at its first input, and produces a second comparison signal indicative of the relative value of the samples;

the control device produces a normalization signal at its second output; and the normalization device receives the normalization signal from the control device at its first input and the second comparison signal at its second input and produces a signal indicative of the direction of change of the test signal.

2. The direction sensor of claim 1 wherein the test switch comprises:

a dual switch having two data inputs and two data outputs;

and a first and second conductor for connecting the data input of the test switch with the two data inputs of the dual switch.

3. The direction sensor of claim 1 wherein the first and second storage devices are each comprised of a capacitor.

4. The direction sensor of claim 1 wherein the comparison device is comprised of a comparator.

5. The direction sensor of claim 1 wherein the normalization device is comprised of a digital gating device.

6. The direction sensor of claim 5 wherein the digital gating device is comprised of an exclusive-or gate.

7. The direction sensor of claim 1 wherein the control device is comprised of a timer.

8. The direction sensor of claim 7 wherein the control device is comprised of a digital gating device.

9. The direction sensor of claim 8 wherein the digital gating circuitry is comprised of an exclusive-or gate.

10. A circuit for controlling two aspects of a signal comprising:

a direction sensor having an input and an output;

an adjustment signal source having an input connected to the output of the direction sensor, and an output at which an adjustment signal is produced;

an output switch having a data input connected to the output of the adjustment signal source, and first and second data outputs adapted for connection to a two parameter circuit for controlling two parameters of a signal, and a control input; and a control device having an output connected to the control input of the output switch;

wherein during a first output cycle:

the control device supplies a first control signal to the control input of the output switch causing the output switch to transfer the adjustment signal at its data input to its first data output and preventing the output switch from transferring the adjustment signal at the output switch's data input to its second data output;

wherein during a second output cycle:

the control device supplies a second control signal to the control input of the output switch causing the output switch to transfer the adjustment signal at its data input to its second data output and preventing the output switch from transferring the adjustment signal at the output switch's data input to its first data output;

and wherein during each output cycle the adjustment signal source is responsive to a direction signal from the direction sensor and the adjustment signal provided is determined at least in part by the direction signal.

11. The circuit of claim 10 wherein the first and second output cycles are repeated.

12. The circuit of claim 10 wherein the first and second data outputs of the switch are adapted to be connected to a two parameter circuit comprising an attenuator and phase circuit which controls the gain and phase of a signal.

13. The circuit of claim 10 wherein the direction sensor is comprised of:

a test switch having a data input, first and second data outputs, and a control input;

a first storage device having an input connected to the first data output of the test switch and an output;

a second storage device having an input connected to the second data output of the test switch and an output;

a comparison device having a first input connected to the output of the first storage device and a second input connected to the output of the second storage device and an output;

a normalization device having a first input connected to the output of the comparison device, a second input and an output;

a control device having a first output connected to the control input of the test switch and a second output connected to the first input of the normalization device;

wherein the direction sensor is adapted to conduct a series of consecutive test cycles, comprised of even numbered and odd numbered test cycles, and during each test cycle a sample of the test signal is taken and:

wherein during the even numbered test cycles:

the control device is adapted to supply a first control signal to the control input of the test switch causing the test switch to transfer an even numbered sample of the test signal at the data input of the test switch to the first data output of the test switch, from where the even numbered sample is supplied to the first storage device and thereafter to the first input of the comparison device;

the comparison device is adapted to compare an even numbered sample at its first input, with an earlier in time odd numbered sample at its second input, and produces a first comparison signal indicative of the relative value of the samples; the control device produces a normalization signal at its second output; and the normalization device receives the normalization signal from the control device at its first input and the first comparison signal at its second input and produces a signal indicative of the direction of change of the test signal; and wherein during the odd numbered test cycles:

the control device is adapted to supply a second control signal to the control input of the test switch causing the test switch to transfer an odd numbered sample of the test signal at the data input of the test switch to the second data output of the switch, from where the odd numbered sample is supplied to the second storage device and thereafter to the second input of the comparison device;

the comparison device is adapted to compare an odd numbered sample at its second input with an earlier in time even numbered sample at its first input, and produces a second comparison signal indicative of the relative value of the samples;

the control device produces a normalization signal at its second output; and the normalization device receives the normalization signal from the control device at its first input and the second comparison signal at its second input and produces a signal indicative of the direction of change of the test signal.

14. The circuit of claim 13 wherein the test switch comprises:

a dual switch having two data inputs and two data outputs;

and a first and second conductor for connecting the data input of the test switch with the two data inputs of the dual switch.

15. The circuit of claim 13 wherein the first and second storage devices are each comprised of a capacitor.

16. The circuit of claim 13 wherein the comparison device is comprised of a comparator.

17. The circuit of claim 13 wherein the normalization device is comprised of a digital gating device.

18. The circuit of claim 17 wherein the digital gating device is comprised of an exclusive-or gate.

19. The circuit of claim 13 wherein the control device is comprised of a timer.

20. The circuit of claim 19 wherein the control device is comprised of digital gating circuitry.

21. The circuit of claim 20 wherein the digital gating circuitry is comprised of an exclusive-or gate.

22. A circuit for reducing distortion comprising:

a signal combiner having a first input adaptable for receiving a distortion signal, a second input, and an output;

a two parameter circuit having a data input, a data output connected to the second input of the signal combiner, and first and second control inputs;

a coupler having an input connected to the output of the signal combiner, a first output, and a second output;

an automatic control circuit having first and second control outputs connected to the first and second control inputs of the two parameter circuit and a first control input connected to the second output of the coupler, the automatic control circuit comprised of:

a direction sensor having an input and an output;

an adjustment signal source having an input connected to the output of the direction sensor, and an output at which a adjustment signal is produced;

an output switch having a data input connected to the output of the adjustment signal source, and first and second data outputs adapted for connection to a two parameter circuit for adjusting two parameters of a correction signal, and a control input; and a control device having an output connected to the control input of the output switch;

wherein during a first output cycle:

the control device supplies a first control signal to the control input of the output switch causing the output switch to transfer the adjustment signal at its data input to its first data output;

wherein during a second output cycle:

the control device supplies a second control signal to the control input of the output switch causing the output switch to transfer the adjustment signal at its data input to its second data output; and wherein during each output cycle:

the adjustment signal source is responsive to a direction signal from the direction sensor and the adjustment signal provided is determined at least in part by the direction signal.

23. The circuit of claim 22 wherein the direction sensor is comprised of:

a test switch having a data input, first and second data outputs, and a control input;

a first storage device having an input connected to the first data output of the test switch and an output;

a second storage device having an input connected to the second data output of the test switch and an output;

a comparison device having a first input connected to the output of the first storage device and a second input connected to the output of the second storage device and an output;

a normalization device having a first input connected to the output of the comparison device, a second input and an output;

a control device having a first output connected to the control input of the test switch and a second output connected to the first input of the normalization device;

wherein the direction sensor is adapted to conduct a series of consecutive test cycles, comprised of even numbered test cycles and odd numbered test cycles, and during each test cycle a sample of the test signal is taken and:

wherein during the even numbered test cycles:

the control device is adapted to supply a first control signal to the control input of the test switch causing the test switch to transfer an even numbered sample of the test signal at the data input of the test switch to the first data output of the test switch, from where the even numbered sample is supplied to the first storage device and thereafter to the first input of the comparison device;

the comparison device is adapted to compare an even numbered sample at its first input, with an earlier in time odd numbered sample at its second input, and produces a first comparison signal indicative of the relative value of the samples;

the control device produces a normalization signal at its second output; and the normalization device receives the normalization signal from the control device at its first input and the first comparison signal at its second input and produces a signal indicative of the direction of change of the test signal; and wherein during the odd numbered test cycles:

the control device is adapted to supply a second control signal to the control input of the test switch causing the test switch to transfer an odd numbered sample of the test signal at the data input of the test switch to the second data output of the switch, from where the odd numbered sample is supplied to the second storage device and thereafter to the second input of the comparison device;

the comparison device is adapted to compare an odd numbered sample at its second input with an earlier in time even numbered sample at its first input, and produces a second comparison signal indicative of the relative value of the samples;

the control device produces a normalization signal at its second output; and the normalization device receives the normalization signal from the control device at its first input and the second comparison signal at its second input and produces a signal indicative of the direction of change of the test signal.

24. The circuit of claim 23 wherein the test switch comprises:

a dual switch having two data inputs and two data outputs;

and a first and second conductor for connecting the data input of the test switch with the two data inputs of the dual switch.

25. The circuit of claim 23 wherein the first and second storage devices are each comprised of a capacitor.

26. The circuit of claim 23 wherein the comparison device is comprised of a comparator.

27. The circuit of claim 23 wherein the normalization device is comprised of a digital gating device.

28. The circuit of claim 27 wherein the digital gating device is comprised of an exclusive-or gate.

29. The circuit of claim 23 wherein the control device is comprised of a timer.

30. The circuit of claim 29 wherein the control device is comprised of digital gating circuitry.

31. The circuit of claim 30 wherein the digital gating circuitry is comprised of an exclusive-or gate.

32. A method for detecting the direction of change of a test signal comprising:

conducting a series of consecutive test cycles and during each test cycle taking a sample of the test signal, the series of consecutive test cycles comprised of odd numbered test cycles and even numbered test cycles and:

during the even numbered test cycles:
storing an even numbered sample of the test signal;
comparing the even numbered sample with an earlier in time odd numbered sample,
producing a first comparison signal indicative of the relative value of the samples;
producing a normalization signal;
producing a signal indicative of the direction of change of the test signal based on the normalization signal and the first comparison signal; and wherein during the odd numbered test cycles:
storing an odd numbered sample of the test signal;
comparing the odd numbered sample with an earlier in time even numbered sample,
producing a second comparison signal indicative of the relative value of the samples;
producing a normalization signal;
producing a signal indicative of the direction of change of the test signal based on the normalization signal and the second comparison signal.

33. The method of claim 32 wherein the even and odd numbered samples are each stored in a capacitor.

34. A method for controlling two aspects of a correction signal comprising:

examining the direction of change of a test signal;

providing an adjustment signal based on the direction of change;

during a first output cycle using the adjustment signal to control a first aspect of the correction signal and preventing the adjustment signal from controlling a second aspect of the correction signal; and during a second output cycle using the adjustment signal to control the second aspect of the correction signal and preventing the adjustment signal from controlling the first aspect of the correction signal.

35. The method of claim 34 wherein the first and second output cycles are repeated.

36. The method of claim 34 wherein the first and second aspects of the correction signal are gain and phase.

37. The method of claim 34 wherein the step of examining the direction of change of the test signal comprises:

conducting a series of consecutive test cycles and during each test cycle taking a sample of the test signal, the series of consecutive test cycles comprised of odd numbered test cycles and even numbered test cycles and:

during the even numbered test cycles:
storing an even numbered sample of the test signal;
comparing the even numbered sample with an earlier in time odd numbered sample,
producing a first comparison signal indicative of the relative value of the samples;
producing a normalization signal;
producing a signal indicative of the direction of change of the test signal based on the normalization signal and the first comparison signal; and wherein during the odd numbered test cycles:
storing an odd numbered sample of the test signal;
comparing the odd numbered sample with an earlier in time even numbered sample,
producing a second comparison signal indicative of the relative value of the samples;
producing a normalization signal;
producing a signal indicative of the direction of change of the test signal based on the normalization signal and the second comparison signal.

38. A method for reducing distortion comprising:

combining a distorted signal and an adjusted correction signal;

feeding back a portion of the combined signal as a test signal;

detecting the direction of change of a component of the test signal;

during a first output cycle using the direction of change to adjust a first parameter of the correction signal;

during a second output cycle using the direction of change to adjust a second parameter of the correction signal;

combining the adjusted correction signal and the distorted signal; and periodically repeating the above steps.

39. The method of claim 38 wherein the step of detecting the direction of change of the test signal comprises:

conducting a series of consecutive test cycles, comprised of even numbered and odd numbered test cycles, during each test cycle taking a sample of the test signal, and:

during the even numbered test cycles:
storing an even numbered sample of the test signal;
comparing the even numbered sample with an earlier in time odd numbered sample,
producing a first comparison signal indicative of the relative value of the samples;
producing a normalization signal;
producing a signal indicative of the direction of change of the test signal based on the normalization signal and the first comparison signal; and wherein during the odd numbered test cycles:
storing an odd numbered sample of the test signal;
comparing the odd numbered sample with an earlier in time even numbered sample,
producing a second comparison signal indicative of the relative value of the samples;
producing a normalization signal;
producing a signal indicative of the direction of change of the test signal based on the normalization signal and the second comparison signal.

40. A direction sensor for detecting the direction of change of a test signal, wherein the direction sensor is adapted to conduct a series of consecutive test cycles comprised of even numbered test cycles and odd numbered test cycles, and during each test cycle a sample of the test signal is taken, the direction sensor comprising:

a first storage means for storing even numbered samples taken during even numbered test cycles of the test signal;

a second storage means for storing odd numbered samples taken during odd numbered test cycles of the test signal;

means for comparing:
during even numbered test cycles, an even numbered sample with an earlier in time odd numbered sample,
during odd numbered test cycles, an odd numbered sample with an earlier in time even numbered sample;
the means for comparing providing an output during both even and odd numbered test cycles indicative of the relationship between an even and an odd numbered sample;

means for normalizing the output from the means for comparing to produce a signal indicative of the direction of change of the test signal.

* * * * *